United States Patent [19]

Kawabe et al.

[11] Patent Number: 4,496,647

[45] Date of Patent: Jan. 29, 1985

[54] TREATMENT OF IMAGE-FORMING LAMINATED PLATE

[75] Inventors: Norio Kawabe, Ohtsu; Mikio Tsuda, Ohmihachiman; Sadao Kobashi, Yohkaichi, all of Japan

[73] Assignee: Toray Industries, Inc., Tokyo, Japan

[21] Appl. No.: 514,963

[22] Filed: Jul. 18, 1983

[30] Foreign Application Priority Data

Jul. 21, 1982 [JP] Japan .................................. 57-125757

[51] Int. Cl.$^3$ ................................................ G03C 7/02
[52] U.S. Cl. ...................................... 430/303; 430/166; 430/309
[58] Field of Search ......................... 430/166, 309, 303

[56] References Cited

U.S. PATENT DOCUMENTS

| | | | |
|---|---|---|---|
| 3,511,178 | 5/1970 | Curtin | 430/303 |
| 3,677,178 | 7/1972 | Gipe | 430/303 |
| 3,894,873 | 7/1975 | Kobayashi et al. | 430/303 |
| 4,197,128 | 4/1980 | Watanabe et al. | 430/166 |
| 4,342,820 | 8/1982 | Kinashi et al. | 430/303 |

FOREIGN PATENT DOCUMENTS

| | | |
|---|---|---|
| 1442374 | 7/1976 | United Kingdom . |
| 2034911A | 6/1980 | United Kingdom . |
| 2064803A | 6/1981 | United Kingdom . |

*Primary Examiner*—Won H. Louie
*Attorney, Agent, or Firm*—Austin R. Miller

[57] ABSTRACT

An image-forming laminated plate, particularly a dry planographic printing unprocessed plate, comprising a base substrate, a photosensitive layer containing a substance with quinonediazide structure and a silicone rubber layer in laminating order is treated with a base after imagewise exposure. In addition, the image-forming laminated plate may be subjected to a whole surface slight exposure to the extent that 5 to 60 molar % of the quinonediazide structure in the photosensitive layer to be exposed is photo-decomposed into carboxylic acid structure before or after the usual imagewise exposure for obtaining a negative working plate, or the image-forming laminated plate may be subjected to a imagewise slight exposure to the same extent without the usual imagewise exposure for obtaining a positive working plate. The base-treatment alone or in combination with the slight exposure enhances both the adhesion of the photosensitive layer to the silicone rubber layer and the solvent resistance of the photosensitive layer in non-image areas.

14 Claims, 11 Drawing Figures

TREATMENT OF IMAGE-FORMING LAMINATED PLATE

BACKGROUND OF THE INVENTION

This invention relates to a process for treating an image-forming laminated plate. In other words, this invention relates to a process for effecting an image formation on the same laminated plate which comprises a base substrate, a photosensitive layer containing a substance with quinonediazide structure and a silicone rubber layer.

Various types of the image-forming laminated plate are well known. Among others, a variety of proposals have been offered to a dry planographic printing plate which is provided with a silicone rubber layer on a photosensitive layer superimposed on a base substrate.

For instance, with respect to a positive working printing plate, U.S. Pat. No. 3,677,178 discloses a planographic printing unprocessed plate laminated with a silicone rubber layer on a photohardening diazo-sensitized layer overlying on an aluminum substrate, and proposes that the unprocessed plate is exposed through a positive transparency and then both the soluble diazo-sensitized layer and the silicone rubber layer in the unexposed areas are washed off with a developer to lay bare the surface of the aluminum substrate as image area.

U.S. Pat. No. 3,894,873 discloses a planographic printing unprocessed plate laminated with a silicone rubber layer on a photoadhesive layer superimposed on a base substrate, and proposes to expose the unprocessed plate through a positive transparency. According to U.S. Pat. No. 3,894,873, the photoadhesive layer in the exposed areas is polymerized and adheres firmly to the silicone rubber layer overlying thereon while the photoadhesive layer in the unexposed areas remains unchanged and retains its original weak adhesion to the silicone rubber layer. Then, by developing with a developer, only the silicone rubber layer in the unexposed areas is removed without difficulty and the underlying oleophilic photoadhesive layer is laid bare, and on the other hand, the silicone rubber layer in the exposed areas is remained on the underlying exposed photoadhesive layer. The bared surface of the oleophilic photoadhesive layer becomes an ink-receptive area or image area and the still remained silicone rubber layer becomes an ink-repellent area or non-image area.

With respect to a negative working printing plate, U.S. Pat. No. 3,511,178 discloses a planographic printing unprocessed plate provided with a silicone rubber layer through an adhesive layer on a photosoluble diazo-sensitized layer superimposed on an aluminum substrate, and proposes that the unprocessed plate is exposed through a negative transparency and the photosensitive layer in the exposed areas is dissolved and removed by a developer simultaneously together with the silicone rubber layer overlying thereon to lay bare the surface of the aluminum substrate as image area.

Further, UK Patent Applications GB No. 2064803A and GB No. 2034911A disclose a planographic printing unprocessed plate comprising a base substrate, a photosensitive layer of photodecomposable type and a silicone rubber layer in a superimposed relation, and propose that the unprocessed plate is exposed through a negative transparency and the silicone rubber layer, as occasion demands, together with the underlying photosensitive layer in the exposed areas is removed by a developer to lay bare the surface of the photosensitive layer or the base substrate as image area.

In the above-mentioned treatment of the image-forming laminated plate, i.e., the treatment for converting the image-forming laminated plate into the printing plate, the adhesion between the photosensitive layer and the silicone rubber layer overlying thereon is a extremely important factor for formation of definite image on the printing plate. The merely strong adhesion therebetween is, however, not sufficient but it is more important to create a large difference between the adhesion of the photosensitive layer to the overlying silicone rubber layer in the exposed areas and that in the unexposed areas.

In addition, the swelling property and solubility of the photosensitive layer in a developer are likewise improtant factors for the same purpose. The merely high solubility and favorable swelling property alone are not sufficient, but it is important as well to create further a large difference of the solubility and swelling property of the photosensitive layer in the exposed areas from those in unexposed areas.

The prior arts have offered several propositions from the foregoing view points. For instance, according to U.S. Pat. No. 3,677,178 the photosensitive layer in the exposed areas is made insoluble into the developer by photo-crosslinking of the diazo group, according to U.S. Pat. No. 3,894,873 the adhesion between the photoadhesive layer and the silicone rubber layer in the exposed areas is made firm by photo-polymerizing the photoadhesive layer, according to U.S. Pat. No. 3,511,178 the diazo photosensitive layer becomes soluble in the developer as a result of exposure, according to GB No. 2034911A the quinonediazide photosensitive layer is made soluble in the developer by the exposure and moreover according to GB No. 2064803A the strength of the adhesion between the photosensitive layer and the silicone rubber layer is reduced by the exposure and the silicone rubber layer in the exposed areas is removed by a development.

As described hereinbefore, in the image-forming laminated plate so far proposed including the cited references, a direct change in the adhesion or the solvent resistance of the photosensitive layer has been caused by the actinic light, for instance, the enhancement or inversely reduction of the adhesive strength between the silicone rubber layer and the photosensitive layer by the exposure and the solubilization or inversely insolubilization of the photosensitive layer in the developer by the exposure. However, according to the conventional treatment for effecting the image formation, neither the difference of the adhesion of the photosensitive layer to the silicone rubber layer between the exposed and unexposed areas nor the difference of the solubility and swelling property of the photosensitive layer between the exposed and unexposed areas is expected to be large enough. Consequently, there are observed some drawbacks of unsatisfactory results. That is, upon the minute alternation of the developing conditions, the areas to be remained on the plate surface, which areas are corresponding to the silicone rubber layer forming the non-image background in the dry planographic printing plate having the upper layer of silicone rubber, may be wholly or partially removed therefrom, leading to the defect in the non-image area. On the other hand, similarly upon the minute alternation of the developing conditions, the areas to be removed from the plate surface, which areas are corresponding to the silicone rubber layer superimposed on the photosensitive layer to be formed into the image area in the dry planographic printing plate having the upper layer of silicone rubber, may be wholly or partially remained thereon, leading to the difficulty or inferiority of development. In such a manner, since either the wholly or partially removal of the non-image area or the difficulty and inferiority of development is caused by the minute alternation of developing conditions, the latitude which allows the formation of definite image, i.e., the latitude of development is very narrow and it is difficult to obtain a sharp image formation.

Furthermore, in the conventional treatment, the image formation largely depends on the temperature and humidity during the development. For instance, even in the practical range of temperature and humidity, the relatively high temperature or relatively high humidity causes the removal of the non-image area and the relatively low temperature or relatively low humidity causes the inferiority of development.

The developing time also has influence on the image formation. For instance, by the long time rubbing with a developing pad or the long time immersion into the developer, a part of the laminated photosensitive and silicone rubber layers in the non-image area, both of which should firmly adhere to each other to form the printing plate, is occasionally removed due to the damage of adhesion therebetween by the developer, or the photosensitive layer to be remained in the image area is occasionally removed during the development due to the swelling and dissolving thereof by the developer. Thus, there can be observed the difference of the image formation between the long time development and the short time development.

Still more, the conventional image formation also largely depends on the rubbing condition during the development, for instance, the load added thereto during rubbing with the developing pad and the number of rubbing. The strong rubbing which means the high load or the large number of rubbing causes the damage of adhesion to remove the non-image area, while the weak rubbing which means the low load or the small number of rubbing causes the poor reproducibility of the image to make the reproducibility of small halftone dots difficult. Thus, the latitude in image reproducibility is narrow.

In addition to the above-mentioned, there are other defects in the treatment hitherto proposed, for instance, the spoiled image fidelity due to the generation of gaseous nitrogen from the photosensitive layer of quinonediazide during the exposure and the retainment of photosensitivity in the developed plate due to the incomplete desensitization leading to the fear of damaging the printing plate in the step of washing the plate surface on the printing machine.

As hereinbefore described, the disadvantages confronted at present in the image formation are the extreme narrowness of latitude in the image reproducibility, the poor solvent resistance and the unfavorable developing speed in the conventional treatment of the image-forming laminated plate, particularly the dry planographic printing unprocessed plate having the photosensitive layer and the silicone rubber layer. These disadvantages are mainly originated in the adhesion between the superimposed layers, especially in the small difference of adhesion between the exposed area and the unexposed area.

The object of the present invention is to obtain a sharp image formation, of which image boundaries are precisely defined, on the image-forming laminated plate, especially the dry planographic printing unprocessed plate.

Another object of the invention is to create a large difference of adhesion of the photosensitive layer to the silicone rubber layer between the image area and the non-image area.

The further object of the invention is to create a large difference of the solvent resistance of the photosensitive layer between the image area and the non-image area.

Moreover, the object of this invention is to enlarge the latitude in the image formation or the latitude of development.

The other objects of the present invention will be apparent from the descriptions hereinafter.

SUMMARY OF THE INVENTION

The present invention provides a process for treating an image-forming laminated plate comprising a base substrate, a photosensitive layer containing a substance with quinonediazide structure and a silicone rubber layer in laminating order, characterized in that the image-forming laminated plate is subjected to a treatment with base after exposing imagewise.

The image-forming laminated plate of the invention may be used as a dry planographic printing unprocessed plate of both negative and positive type.

According to the present invention, in addition to the above-mentioned treatment with base, the image-forming laminated plate may be subjected to a slight exposure before or after the conventional imagewise exposure for obtaining a negative working printing plate, or may be subjected to the slight exposure imagewise without the conventional imagewise exposure for obtaining a positive working printing plate. The slight exposure described herein means the exposure to the extent that 5 to 60 molar % of the quinonediazide structure in the photosensitive layer to be exposed is photo-decomposed into a carboxylic acid structure. Generally, the quinonediazide structure is known to be photo-decomposed into the carboxylic acid structure by means of the exposure, and the conventional imagewise exposure usually photo-decomposed 70 molar % or more of the quinonediazide structure in the photosensitive layer to be exposed imagewise into the carboxylic acid structure. Surprisingly, in this invention, it has been found that the slight exposure to the extent that 5 to 60 molar % of the quinonediazide structure in the photosensitive layer to be exposed is photo-decomposed, in combination with the treatment with base, offers more firm adhesion between the photosensitive layer and the silicone rubber layer and higher solvent resistance of the photosensitive layer than those of unexposed state and moreover than the exposure to the extent that at least 70 molar % of the quinonediazide structure is photo-decomposed or the conventional full imagewise exposure.

Accordingly, by making use of the slight exposure and the treatment with base according to the present invention, there can be expected a remarkable difference of the adhesion of the photosensitive layer to the silicone rubber layer and a remarkable difference of the solvent resistance of the photosensitive layer between the image area and the non-image area.

In this invention, in stead of producing a specified amount of carboxylic acid structure in the photosensitive layer by the slight exposure, the same specified amount of a substance having the carboxylic acid structure may be preliminarily incorporated into the photosensitive layer.

For producing a negative working dry planographic printing plate from the image-forming laminated plate of the invention, the laminated plate is subjected to the slight exposure on a whole surface thereof to the extent that 5 to 60 molar % of the quinonediazide structure in the photosensitive layer is photo-decomposed, hereinafter referred to as a whole surface exposure or a whole surface slight exposure, and then exposed imagewise through a negative film or a negative original to the extent that at least 70 molar % of the quinonediazide structure in the photosensitive layer to be exposed imagewise is photo-decomposed to form a latent image, and subsequently the thus exposed laminated plate is subjected to the treatment with base before or at the same time of development.

Alternatively, the negative working dry planographic printing plate is produced from the image-forming laminated plate of the invention by exposing imagewise through the negative film or negative original to the extent that at least 70 molar % of the quinonediazide structure in the photosensitive layer to be exposed imagewise is photo-decomposed to form a latent image, followed by subjecting to the whole suface slight exposure and subsequently by treating with the base before or at the same time of development.

Another negative working dry planographic printing plate may be also produced from the image-forming laminated plate without the slight exposure wherein the laminated plate is exposed imagewise to the extent that at least 70 molar % of the quinonediazide structure in the photosensitive layer to be exposed imagewise is photo-decomposed through the negative film or negative original to form a latent image and subsequently the laminated plate thus exposed imagewise is treated with the base before or at the same time of developing. In this case, the treatment with base alone is likewise effective in enhancing the difference of the adhesion of the photosensitive layer to the silicone rubber layer and the difference of the solvent resistance of the photosensitive layer between the unexposed area and the fully exposed area.

For obtaining a positive working dry planographic printing plate, the image-forming laminated plate according to the present invention is subjected to the imagewise slight exposure through a positive film or a positive original to the extent that 5 to 60 molar % of the quinonediazide structure in the photosensitive layer to be exposed imagewise is photodecomposed to form a latent image, and subsequently is treated with the base before or at the same time of developing.

DETAILED DESCRIPTION OF THE INVENTION

Figure 1:
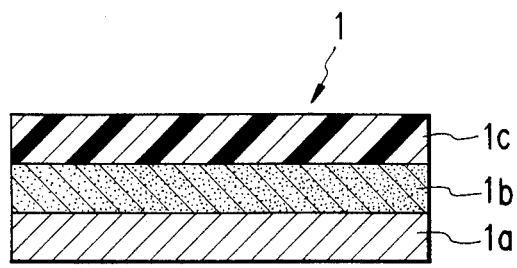
FIG. 1 illustrates the image-forming laminated plate comprising the base substrate, the photosensitive layer and the silicone rubber layer in this superimposed order.

Referring to FIG. 1, indicated is the image-forming laminated plate 1 of the present invention, which comprises a base substrate 1a, a photosensitive layer 1b containing a substance having quinonediazide structure and a silicone rubber layer 1c.

Figure 2A:
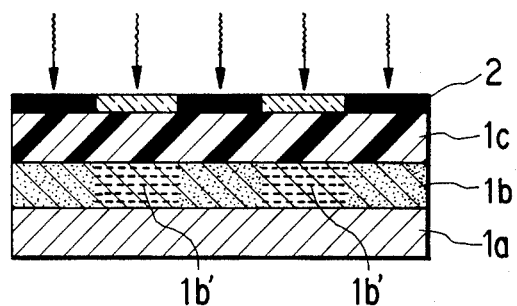
FIGS. 2(A), 2(B), 2(C), 3(A), 3(B), 3(C), 4(A) and 4(B) illustrate the procedures of treating the image-forming laminated plate for obtaining the negative working dry planographic printing plate, respectively.
Figure 2B:
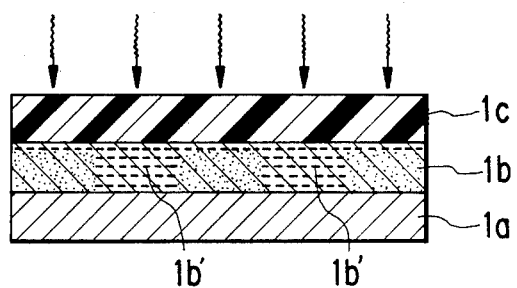
Figure 2C:
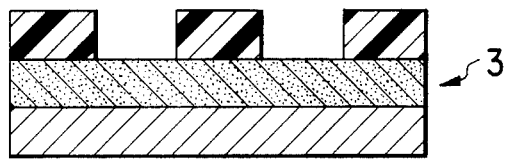

After letting an image-bearing negative transparency 2 contact closely to the surface of the image-forming laminated plate 1, the imagewise exposure is carried out on the image-forming laminated plate 1 to form the imagewise exposed area 1b' in the photosensitive layer 1b as shown in FIG. 2 (A). In the imagewise exposed area 1b', more than 70 molar % of the quinonediazide structure is photo-decomposed. Then, removing the negative transparency 2 from the image-forming laminated plate 1, the whole surface of image-forming laminated plate is subjected to the slight exposure as shown in FIG. 2 (B). Subsequently, the thus treated image-forming laminated plate 1 is subjected to the treatment with base and the development to remove the silicone rubber layer 1c on the imagewise exposed area 1b', thereby obtaining the negative working dry planographic printing plate 3 as shown in FIG. 2 (C).

Figure 3A:
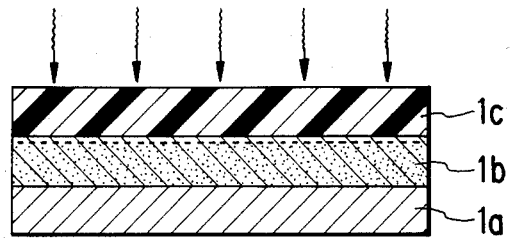
Figure 3B:
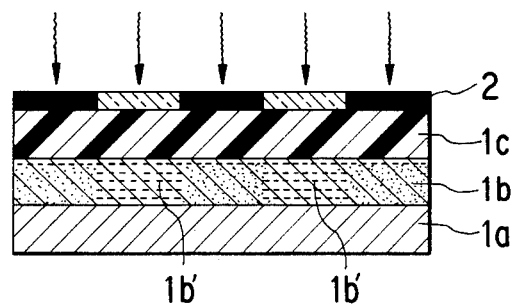
Figure 3C:
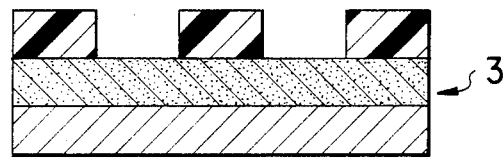

The negative working dry planographic printing plate 3 may be obtained, as illustrated in FIG. 3, through the slight exposure (FIG. 3(A)) on whole surface of the image-forming laminated plate 1 and then by letting the negative transparency 2 contact closely to the surface of the image-forming laminated plate 1 followed by exposing imagewise to the extent that more than 70 molar % of the quinonediazide structure in the imagewise exposed area 1b' is photo-decomposed (FIG. 3 (B)) and thereafter by effecting the same procedures of the treatment with base and the development of FIG. 2 (FIG. 3 (C)).

Figure 4A:
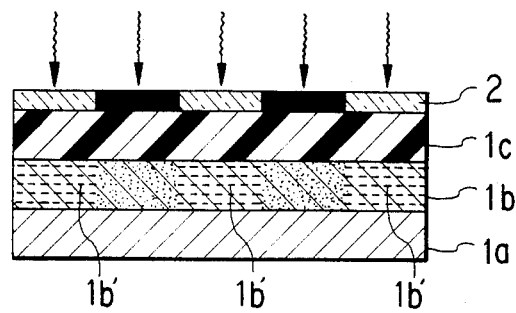
Figure 4B:
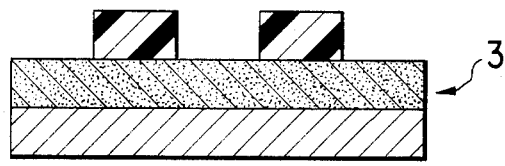

Alternatively, as illustrated in FIG. 4, the negative working dry planographic printing plate 3 is formed by letting the negative transparency 2 contact closely to the surface of the image-forming laminated plate 1 and exposing imagewise through the negative transparency 2 to the extent that more than 70 molar % of the quinonediazide structure in the photosensitive layer is photo-decomposed in the exposed area 1b' (FIG. 4 (A)), and then effecting the treatment with base and the development to remove the silicone rubber layer in the exposed area 1b' (FIG. 4 (B)).

Figure 5A:
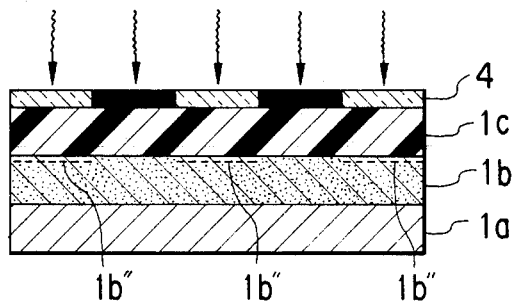
FIGS. 5(A) and 5(B) illustrate the procedures of treating the image-forming laminated plate for obtaining the positive working dry planographic printing plate.
Figure 5B:
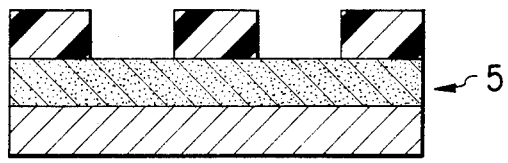

The positive working dry planographic printing plate 5 is produced, as illustrated in FIG. 5, by letting an image-bearing positive transparency 4 contact closely to the surface of image-forming laminated plate 1 followed by slightly exposing imagewise through the positive transparency 4 to the extent that 5 to 60 molar % of the quinonediazide structure in the photosensitive layer is photo-decomposed in the imagewise exposed area 1b'' (FIG. 5 (A)), and subsequently effecting the treatment with base and the development to remove the silicone rubber layer in the unexposed area (FIG. 5 (B)).

Though the explanation mentioned above is directing only to the removal of the silicone rubber layer in the image area, the whole or partial removal of the photosensitive layer in the image area together with the silicone rubber layer may be explained likewise.

In the treatment of the image-forming laminated plate according to the present invention, the treatment with base plays an important role. Namely, upon the treatment with base, the area of the photosensitive layer subjected to the slight exposure to the extent that 5 to 60 molar % of the quinonediazide structure in the photosensitive layer is photodecomposed becomes more adherent to the silicone rubber layer overlying thereon and becomes more resistant to the developer. As a result, both the area of the photosensitive layer and the area of the silicone rubber layer overlying thereon are retained firmly on the base substrate without being removed by the development to form the non-image area.

On the other hand, the area of the photosensitive layer subjected to the full exposure to the extent that more than 70 molar % of the quinonediazide structure is photo-decomposed into the carboxylic acid structure becomes less adherent inversely to the silicone rubber layer overlying thereon and occasionally becomes less resistant to the developer upon the treatment with base. As a result, the area of the silicone rubber layer overlying on the area of the photosensitive layer photodecomposed to such extent or occasionally the both areas are removed by the development to form the image area.

The amount of the quinonediazide structure in the photosensitive layer photodecomposed by the whole surface slight exposure and the imagewise full exposure is based on the original amount of the quinonediazide structure contained in the photosensitive sensitive layer which is not yet exposed. Accordingly, for instance, when 5 to 60 molar % of the quinonediazide structure is photo-decomposed by the whole surface slight exposure and then the imagewise full exposure is effected, the imagewise full exposure is effected not to the extent that more than 70 molar % of the quinonediazide structure still remained after the whole surface slight exposure is photo-decomposed, but to the extent that more than 70 molar % of the original amount of the quinonediazide structure is photo-decomposed as total amount of the whole surface slight exposure and the imagewise full exposure.

The photosensitive layer of the present invention consists essentially of the known substance having quinonediazide structure. The substance having the quinonediazide structure herein mentioned is quinonediazides usually applied to a positive working PS plate, wipe-on plate, photoresist and the like. Such a quinonediazide may be a monomer, oligomer or polymer, and may be an ester of quinonediazide sulfonic acid obtained by condensation with a compound having hydroxy group or quinonediazide sulfonic amide obtained by condensation with an amine. More particularly, the quinonediazide according to the invention is exemplified by an ester of polyhydroxybenzene with benzoquinone-1,2-diazidesulfonic acid or naphthoquinone-1,2-diazidesulfonic acid (herein and hereinafter "ester" includes complete and partial esters), ester of pyrogallol-acetone resin with naphthoquinone-1 2-diazide-4-sulfonic acid or naphthoquinone-1,2-diazide-5-sulfonic acid, ester of phenol-formaldehyde novolak resin or cresol-formaldehyde novolak resin with benzoquinone-1,2-diazidesulfonic acid or naphthoquinone-1,2-diazidesulfonic acid, amide of poly(p-aminostyrene) with naphthoquinone-1,2-diazide-4-sulfonic acid or naphthoquinone-1,2-diazide-5-sulfonic acid, ester of poly(p-hydroxystyrene) with naphthoquinone-1,2-diazide-4-sulfonic acid or naphthoquinone-1,2-diazide-5-sulfonic acid, ester of polyethylene glycol with naphthoquinone-1,2-diazide-4-sulfonic acid or naphthoquinone-1,2-diazide-5-sulfonic acid, amide of polymerized amine with naphthoquinone-1,2-diazide-4-sulfonic acid or naphthoquinone-1,2-diazide-5-sulfonic acid, ester of polymethacrylic acid p-hydroxyanilide with naphthoquinone-1,2-diazide-4-sulfonic acid or naphthoquinone-1,2-diazide-5-sulfonic acid, amide of amine-modified natural rosin resin with naphthoquinone-1,2-diazide-5-sulfonic acid, ester of naphthoquinone-1,2-diazide-5-sulfonic acid with an epoxy resin prepared from bisphenol A and propylene oxide, ester of naphthoquinone-1,2-diazide-4-sulfonic acid or naphthoquinone-1,2-diazide-5-sulfonic acid with a polymer of monoester prepared from methacrylic acid and dihydroxybenzene, a polymer of condensate of diallylaminoisophthalate and naphthoquinone-diazidesulfonic acid, ester of polycarbonate with quinonediazidesulfonic acid, a crosslinked product of quinonediazides by polyisocyanate and the like, ester of bisphenol A with naphthoquinone-1,2-diazide-4-sulfonic acid or naphthoquinone-1,2-diazide-5-sulfonic acid, ester of naphthoquinone-1,2-diazide-5-sulfonic acid with one of phenols such as phenol and p-cresol or one of alcohols such as ethanol, propanol, butanol, amyl alcohol and the like, acid amides of naphthoquinone-1,2-diazide-5-sulfonic acid and one of amines such as aniline, p-hydroxyaniline and the like. A photosensitive resin having quinonediazide structure is especially preferable as the substance having quinonediazide structure.

In the photosensitive layer may be incorporated other components with a view to improving the film forming property or adhesion to the base substrate, other polymer or monomer insoluble in the developer to remain wholly or partially the photosensitive layer in the image areas, or dyestuffs for making image visible at the time of development or exposure, provided that such incorporation should not spoil the effect of this invention.

The thickness of the photosensitive layer is in the range of about 0.1 to 100$\mu$, preferably from about 0.5 to 30$\mu$. A small thickness is likely to cause defects such as the formation of pinholes at the time of coating, while a large thickness is disadvantageous from the economical point of view.

The extent of the photo-decomposition of the quinonediazide structure in the photosensitive layer hereinbefore mentioned is estimated by measuring in an infrared absorption spectrum (FT-IR-ATR method) the variation of absorption intensity of infrared ray in the range of 2000 to 2200 cm$^{-1}$ of the diazide group of the quinonediazide structure or the variation of the integrated absorption area in the same range before and after the exposure. Based on the characteristic infrared absorption for quinonediazide structure which appears in the range of 2000 to 2200 cm$^{-1}$, the term "molar %" which indicates the extent of photo-decompostion is defined as the relative ratio between the absorption intensity before and after the exposure.

The conversion of the quinonediazide structure into the carboxylic acid structure by the exposure is generally known. For instance, the photosensitive substance derived from naphthoquinone-1,2-diazide-5-sulfonic acid and phenolformaldehyde novolak resin has the carboxylic acid structure of indene carboxylic acid upon subjected to the exposure. To expose image-forming laminated plate so as to photodecompose the specified amount of the quinonediazide structure in the photosensitive layer is to expose the plate so as to produce the corresponding amount of the carboxylic acid structure in the photosensitive layer by the photodecomposition. The amount of exposing light to be irradiated on the photosensitive layer is not definately determined, which is changeable according to the original amount of the quinonediazide structure in the photosensitive layer and the intensity of the exposing light.

The base employable in the treatment with base according to the present invention is any one of bases generally known in chemical fields and defined as a proton acceptor or an electron donor. The base may be either inorganic or organic and exemplified as follows:

An organic base, preferably the organic base of 1 to 30 carbon atoms, includes amine compounds (primary-, secondary-and tertiary amine, mono-, di-, tri-, tetra- and polyamine and aliphatic-, cycloaliphatic-, aromatic and heterocyclic amine) such as monomethylamine, dimethylamine, trimethylamine, monoethylamine, diethylamine, triethylamine, propylamine, dipropylamine, tripropylamine, butylamine, dibutylamine, tributylamine, amylamine, diamylamine, methyldiethylamine, ethylenediamine, trimethylenediamine, tetramethylenediamine, polyethyleneimine, benzylamine, N,N-dimethylbenzylamine, N,N-diethylbenzylamine, N,N-dipropylbenzylamine, o-, m- or p-methoxybenzylamine, o-, m- or p-methylbenzylamine, N,N-di(methoxybenzyl)amine, $\beta$-phenylethylamine, $\epsilon$, $\delta$-phenylamyamine, $\gamma$-phenylpropylamine, cyclohexylamine, aniline, monomethylaniline, dimethylaniline, toluidine, benzidine, $\alpha$- or $\beta$-naphthylamine, o-, m- or p-phenylenediamine, pyrrolidine, piperidine, piperazine, morpholine, hexamethylenetetramine, diazabicycloundecane, pyrrole, pyridine, quinoline, phenylhydrazine, N,N'-diphenylhydrazine urea, semicarbazide, thiourea, lysine, histidine, quinine, brucine, caffeine, cinchonine, cocaine, strychinine, tetraalkyl ammonium hydroxide, aminobenzoic acid, foramide, acetamide, N,N-dimethylformamide, N,N-dimethylacetamide, acetanilide, mono-, di- and triethanolamine, 2-(2-aminoethyl)-ethanol, 2-amino-2-methyl-1,3-propanediol, 2-amino-1,3-propanediol, 2-amino-2-hydroxymethyl-1,3-propanediol; amine derivatives such as acid amide; amine salts of carboxylic acid such as monoethanolamine octanoate, diethanolamine octanoate, etc.; alcoholates of an alkali metal such as sodium-, potassium-, lithium methylate, sodium-, potassium-, lithium ethylate and sodium- and potassium propylate; and amides of an alkali metal such as amide, ethylamide and dipropylamide of sodium, potassium and lithium.

An inorganic base includes hydroxides of alkali metal and alkaline earth metal such as sodium hydroxide, potassium hydroxide, lithium hydroxide, calcium hydroxide and barium hydroxide; carbonates of alkali metal and alkaline earth metal such as sodium carbonate, potassium carbonate, lithium carbonate, calcium carbonate, barium carbonate, sodium hydrogencarbonate and potassium hydrogencarbonate; cyanides of alkali metal and alkaline earth metal such as potassium cyanide and sodium cyanide; phosphate of alkali metal and alkaline earth metal such as sodium phosphate and potassium phosphate; silicates of alkali metal and alkaline earth metal such as sodium silicate, potassium silicate and sodium metasilicate; and ammonia (ammonium hydroxide), hydrazine and hydroxylamine.

In addition, a basic salt may also be allowable as the base above-mentioned, for instance, a basic salt of acid such as carboxylic acid and phosphate with alkali metal or alkaline earth metal.

Among those bases mentioned above, organic bases are preferable, and among these organic bases, amine compounds are more preferable. The most preferable amine compound is a primary amine.

The base of the invention may be used alone or in mutual admixture in the state of either liquid or gas. In case of liquid, the base is used as it is or in a form of solution in a solvent. The solvent may be water, an organic solvent or a mixture thereof. The base may also be combined with the developer.

The amount of the base for the treatment with base is not definitely determined both in the liquid phase and in the gaseous phase. The minimum amount of the base for inducing the efficiency of the treatment with base is apparently indispensable, but more amount of the base does not detrimentally affect the efficiency once induced. When the concentration of the base is low, much amount of liquid or gas may be applied to the object to be treated, while when the concentration is high, small amount of liquid or gas may be applied. The practical concentration is in the range of more than 0.01 % and less than 50 %, preferably more than 0.1 % and less than 30 to 40 % in gaseous phase and in the range of more than 0.001 % and less than 100%, preferably more than 0.01 % and less than 50 % in the liquid phase from the view points of the strength of the base, easiness of the operation, safety and the practical time of the operation.

The time period of the treatment with base may be from a few seconds to 30 min, however, in no way limited. The efficiency of the base appears as soon as the base is brought into contact with the object to be treated, and the efficiency is maintained even if the time period of the treatment is elongated further.

In the case where the image-forming laminated plate after the exposure is treated with the liquid base, the plate may be immersed into the base itself or a solution thereof or the surface of the exposed plate may be wetted with the base itself or the solution thereof, and on the other hand, in the case of treating the plate in a gaseous phase, the surface of the plate may be exposed to the gaseous phase containing the base.

The silicone rubber layer according to this invention consists mainly of a linear organopolysiloxane of several thousand to several hundred thousand molecular weight having the following repeating unit:

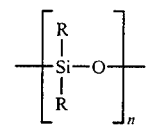

wherein n is an integer not less than 2 and R is $C_1$ to $C_{10}$ alkyl, alkenyl or phenyl group. More than 60% of R is preferably methyl group. The most preferable organopolysiloxane is a polydimethylsiloxane which has a methyl group in each R moiety of the above formula.

The silicone rubber is obtained by scarcely cross-linking the linear organopolysiloxane. For the scarce cross-linkage, such a linear organopolysiloxane may be mixed with a silicone cross-linking agent which is the so-called room temperature (low temperature) vulcanizing type used for silicone rubber, e.g. acetoxysilanes, ketoximesilanes, alkoxysilanes, aminosilanes, amidesilanes and alkenyloxysilanes. By these cross-linking agents in combination with a hydroxy-terminated linear organopolysiloxane, produced is a deacetic acid type, deoxime type, dealcohol type, deamine type, deamide type, deketone type or deacetone type silicone rubber.

The following silicone cross-linking agents are especially preferable;

| (i)   | R—Si(OR)₃          | (dealcohol type)    |
|-------|--------------------|---------------------|
| (ii)  | R—Si(OAc)₃         | (deacetic acid type)|
| (iii) | R—Si(ON=CR'₂)₃     | (deoxime type)      |
| (iv)  | R—Si(OC(R')CH=CH₂)₃| (deketone type)     | wherein R is the same as defined above, R' is an alkyl group such as methyl and ethyl group and Ac is an acetyl group.

To these silicone rubbers, in general, is further added a small amount of an organotin compound or the like as a catalyst.

The thickness of the silicone rubber layer of the invention is in the range of about 0.5 to 100μ, preferably about 0.5 to 50μ. Too small thickness causes inferior durability in printing, while too large thickness is disadvantageous from the economical point of view and also gives difficulty of removing silicone rubber in development which leads to inferior image reproducibility.

In the image-forming laminated plate of the present invention, the adhesion between the base substrate and the photosensitive layer and the adhesion between the photosensitive layer and the silicone rubber layer are extremely important for fundamental performances of the printing plate such as image reproducibility and durability in printing. Accordingly, an adhesive layer may be provided between each layer or an adhesion-improving component may be incorporated into each layer as occasion demands.

Though various adhesive layers are employable for increasing the bonding strength of the silicone rubber layer to the photosensitive layer, an aminosilane layer is preferable among others. The aminosilane is represented by the following general formula:

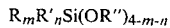

wherein R is an alkyl group having unsubstituted or substituted amino group, R' and R" are an alkyl or aryl group respectively m is an interger of 1 or 2 and n is 0 or 1 m+n being equal to 1 or 2. Typical of such aminosilane includes, for instance, 3-aminopropyltriethoxysilane, N-(2-aminoethyl)-3-aminopropyltrimethoxysilane, 3-aminopropyltrimethoxysilane, bis[3-(trimethoxysilyl)propyl]amine, bis[3-(trimethoxysilyl)propyl]ethylenediamine, N-(3-trimethoxysilylpropyl)morpholine, trimethoxysilylpropyldiethylenetriamine, bis(2-hydroxyethyl)aminopropyltriethoxysilane, 3-aminopropylmethyldiethoxysilane, (N,N-diethyl-3-amino)propyltrimethoxysilane, (N N-dimethyl-3-amino)propyltrimethoxysilane, N-methylaminopropyltrimethoxysilane N-phenylaminopropyltrimethoxysilane, 1-trimethoxysilyl-2-(p-m-aminomethyl)phenylethane, trimethoxysilylpropylallylamine and the like.

An organotitanate is also preferable for increasing the bonding strength between the photosensitive layer and the silicone rubber layer. The organotitanate herein mentioned is a titanium-primer represented by the general formula:

Ti(OR)₄, Ti(OCOR')₄₋ₙ(OR)ₙ, or

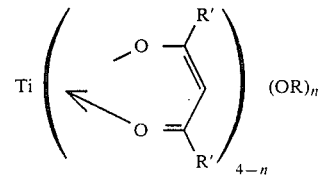

wherein R and R' may be the same or different from each other and are an alkyl, aryl, cycloalkyl or alkenyl group and n is 0, 1, 2 or 3. Typical of such organotitanate includes, for instance, tetraalkyltitanate such as titanium tetraisopropoxide, titanium tetra-n-butoxide, titanium tetrastearoxide and tetrakis-(2-ethylhexyl)titanate, titanium chelate such as dipropoxy bis-(acetylacetonato)titanium, dibutoxy bis-(acetylacetonato)titanium, bibutoxy bis(triethanolaminato)titanium, dihydroxy bis(lactato)titanium and tetrakis(2-ethylhexanediorato)titanium, titanium acylate such as tri-n-butoxytitanium monostearate and titanium tetrabenzoate and association products thereof or polymer thereof.

Regarding the thickness of the adhesive layer, it is basically sufficient to have a thickness of monomolecular layer or more, but a value ranging from 0.01 to 2μ may be selected in view of the actual operation of application. Too large thickness is not only disadvantageous from the economical point of view but also badly affects the permeation of developer to the photosensitive layer.

Various adhesion-improving components may be incorporated into the silicone rubber layer for the adhesion thereof to the photosensitive layer. Among them, the aminosilane and organotitanate explained as above are preferable. The amount of aminosilane or organotitanate contained in the silicone rubber layer is preferably of 0.05 to 10% by weight, more preferably 0.1 to 5% by weight of the linear organopolysiloxane. In addition, a blend of the aminosilane and the organotitanate or a blend of each with another adhesive may be applicable as the adhesion-improving component.

The base substrate of the present invention should be flexible enough to be set in a conventional planographic printing machine and be strong enough to withstand the stress encountered in printing. Typicals of the base substrate are metallic plates such as aluminum, copper and steel, plastic films or sheets such as polyethylene terephthalate, coated papers, rubber films or sheets, composite substrate, substrate with rubber elasticity, substrate having a layer of rubber elasticity, cylindrical substrate and the like. A further coating may be applied onto these substrates for the prevention of halation or for other purposes.

To protect the uppermost silicone rubber layer of the image-forming laminated plate, or for other purposes, a thin protective film or sheet with even or uneven surface may be laminated on the surface of the silicone rubber layer. To illustrate the protective film, mention may be made of plastic films such as polyethylene terephthalate, polypropylene, polyethylene, polystyrene, polyvinyl chloride, polyvinylidene chloride and cellophane. The protective film may be removed before or after the imagewise exposure both in negative and positive. The film which is placed on the silicone rubber layer during the imagewise exposure should have a transparency capable of transmitting ultraviolet rays and a thickness not larger than 100μ, preferably not larger than 30μ to prevent spoiling of image fidelity in exposure.

Thus, the constitution of the image-forming laminated plate according to the invention comprises in the order the base substrate, the photosensitive layer with or without sandwiching the adhesive layer or primer layer thereunder, the silicone rubber layer with or without sandwiching another adhesive layer thereunder and, if necessary, the protective layer. The image-forming laminated plate is manufactured for example in the following manner. First, onto the base substrate with or without the adhesive or primer layer is applied a solution of a photosensitive layer forming composition by the use of a conventional coater such as reverse roll coater, air knife coater or Mayer bar coater, or a rotary applicator such as whirler, followed by drying and if required heat-curing, then, if required after applying the adhesive layer onto the photosensitive layer in the same manner followed by drying, a silicone rubber solution is applied thereonto in the same manner followed by heat treatment usually at a temperature of 100° C. to 130° C. for several minutes to allow curing to take place to a satisfactory extent to form the silicone rubber layer. If necessary, the thus formed silicone rubber layer is covered with the protective film by means of a laminator or the like.

The slight exposure including the imagewise slight exposure and the whole surface slight exposure may favorably be carried out by a flash exposure which can offer the necessary amount of exposing light within a short time. When employing the flash exposure, the negative working dry planographic printing plate is obtained in such a manner that the whole surface exposure is firstly carried out with the flash exposure followed by the imagewise full exposure, or otherwise the imagewise full exposure is firstly carried out followed by the whole surface exposure with the flash exposure, and then the treatment with base is operated before or at the same time of the development. Alternatively, the positive working dry planographic printing plate is obtained in such a manner that the image-forming laminated plate is slightly exposed imagewise with the flash exposure followed by treating with the base before or at the same time of the development.

The photo-decomposition of more than 70 molar % of the quinonediazide structure in the photosensitive layer to produce the much more amount of the carboxylic acid structure in the imagewise exposed area may be carried out by irradiating the image-forming laminated plate with the sufficient amount of exposing light under the conventional exposing operation in the procedures for making the printing plate.

The whole surface slight exposure may be carried out, in stead of on the completely manufactured image-forming laminated plate or dry planographic printing unprocessed plate, in the course of the manufacture thereof. In this case, the whole surface slight exposure is offered after coating the photosensitive layer or after coating the silicone rubber layer, or as occasion demands, after laminating the protective film either in the line or out of the line of manufacturing.

In the imagewise exposure, the image-forming laminated film is exposed to the actinic light through the image-bearing negative or positive transparency closely adhered to the plate in vacuo (close adhesion exposure), or is projectively exposed to the actinic light transmitted through the image-bearing negative or positive transparency (projection exposure), or is exposed to the actinic light reflected from the image-bearing negative or positive original (direct plate making).

According to the present invention, both the positive working and the negative working printing plates can be formed from the same image-forming laminated plate by controlling the exposure or exposing time. That is, the image-forming laminated plate can offer the positive working printing plate by exposing through the positive film or original so as to photodecompose imagewise 5 to 60 molar % of the quinonediazide structure in the photosensitive layer to be exposed followed by the treatment with base and the development, while the same image-forming laminated plate can offer the negative working printing plate as well by conventionally exposing imagewise through the negative film or original before or after the whole surface exposure to the extent that 5 to 60 molar % of the quinonediazide structure in the photosensitive layer is photodecomposed in the non-image area, or without the whole surface exposure, followed by the subsequent treatment with base and the development.

The light source used in the exposing step of the invention is not specially limited, but should generate a light of wavelength region such as ultraviolet rays, which can cause the photo-reaction to convert the quinonediazide structure into the carboxylic acid structure. Super high-pressure mercury lamps, carbon arc lamps, xenone lamps, metal halide lamps, fluorescent lamps, chemical lamps and sun light, etc. meet this requirement Other than the ultraviolet rays and laser rays may be employable.

The treatment with base according to the present invention is effected on the image-forming laminated plate after the completion of the exposure operation. The treatment with base is conducted before or at the same time of the development. The treatment with base at the same time of the development herein referred means to conduct the developing operation with a developer containing the base for the base-treatment. In case of the negative working dry planographic printing plate, by developing, for instance, rubbing the exposed plate with the developing pad, the silicone rubber layer, as occasion demands, together with the underlying photosensitive layer in the imagewise exposed area is removed to lay bare the surface of the photosensitive layer or the surface of the base substrate as the ink-receptive area. In case of the positive working dry planographic printing plate by the development the silicone rubber layer, as occasion demands, together with the photosensitive layer in the unexposed area is removed to lay bare the surface of the photosensitive layer or the surface of the base substrate as the ink-receptive area.

With respect to the developer employable in this invention, any known developer for the dry planographic printing plate may be usable, for instance, those prepared by adding a polar solvent mentioned below to an aliphatic hydrocarbon such as hexane, heptane, "Isopar ® E, H, G" (aliphatic hydrocarbons manufactured and sold by Exxon Corp.), gasoline and kerosene, an aromatic hydrocarbons such as toluene and xylene or a halogenohydrocarbon such as trichloroethylene;
  (i) water,
  (ii) alcohols such as methanol and ethanol,
  (iii) ethers such as methylcellosolve, ethylcellosolve, butylcellosolve, methylcarbitol, ethylcarbitol, butylcarbitol and dioxane, (iv) ketones such as acetone and methyl ethyl ketone, and (v) esters such as ethyl acetate, methylcellosolve acetate, cellosolve acetate and carbitol acetate.

In addition, a dyestuff such as Crystal Violet, Astrazon Red and the like may be added to the developer while simultaneously conducting the development and the dyeing of the photosensitive layer.

In the process for treating the image-forming laminated plate, particularly the treatment of the same plate comprising the base substrate, the photosensitive layer of quinonediazide structure and the silicone rubber layer to convert it into the dry planographic printing plate, the image area and the non-image area of the resultant printing plate are explained as follows:

The non-image area is the slightly exposed area in which 5 to 60 molar % of the quinonediazide structure in the photosensitive layer is photo-decomposed into the carboxylic acid structure before the treatment with base. More in detail, the area wherein the photodecomposition is imagewise done by the slight imagewise exposure forms the non-image area of the positive working printing plate, while the area wherein the same photodecomposition is done by the whole surface slight exposure forms the non-image area of the negative working printing plate.

On the other hand, the image area is the substantially unexposed area or the imagewise fully exposed area in which more than 70 molar % of the quinonediazide structure in the photosensitive layer is photo-decomposed into the carboxylic acid structure. More in detail, the substantially unexposed area is corresponding to the image area of the positive working printing plate, while the imagewise exposed area to the above-mentioned extent is corresponding to the image area of the negative working printing plate.

In the negative working printing plate produced without effecting the slight exposure according to the invention, the non-image area is corresponding to the unexposed area in which the quinonediazide structure in the photosensitive layer is not substantially photo-decomposed, while the image area is corresponding to the imagewise exposed area in which more than 70 molar % of the quinonediazide structure in the photosensitive layer is photo-decomposed into the carboxylic acid structure.

The treatment with base alone or in combination with the slight exposure according to the present invention enhances the difference of adhesion of the photosensitive layer to the silicone rubber layer between the image area and the non-image area and further enhances the difference of solvent resistance of the photosensitive layer between the image area and the non-image area, though the mechanism thereof is not definitely Therefore, the remarkable improvement elucidated at present. in the adhesion of the photosensitive layer to the silicone rubber layer and the remarkable improvement in the solvent resistance of the photosensitive layer are expected by the treatment with base in the area wherein the specified amount of carboxylic acid structure, especially formed by photodecomposing the quinonediazide structure by means of the slight exposure, is presented in the photosensitive layer. Since the area wherein more amount of the carboxylic acid structure than the specified amount is presented in the photosensitive layer is not expected such improvements, the area has relatively weak adhesion of the photosensitive layer to the silicone rubber layer and so the silicone rubber layer occasionally together with the photosensitive layer in the same area is removed without difficulty by the developing operation.

As illustrated above, the image formation of the present invention makes use of not only the direct change in the adhesion and the solvent resistance from the original unexposed state to the exposed state in the conventional image formation, but also the enhanced improvements of the adhesion and the solvent resistance which is caused by the treatment with base alone or in combination with the slight exposure. Accordingly, in this invention there can be expected larger difference of the adhesion and the solvent resistance between the image area and the non-image area than the conventional image formation.

The advantages according to the present invention are as follows:

(1) The adhesion between the photosensitive layer and the silicone rubber layer is remarkably enhanced in the non-image area, (2) The solvent resistance of the photosensitive layer is remarkably enhanced in the non-image area, (3) The negative working and positive working printing plates are formed from the same image-forming laminated plate, (4) Since the difference of the adhesion of the photosensitive layer to the silicone rubber layer and the solvent resistance of the photosensitive layer between the image area and the non-image area is sufficiently large, the latitude of development is remarkably enlarged and the image formation is hardly influenced by the foreign factors such as temperature, humidity and the developing time during the developing operation, (5) A series of printing plates having fixed qualities is obtainable even if enlarging the acceptable conditions in the procedures for making the printing 0nprocessed plate (the enlargement of the latitude in production), (6) A highly sensitive positive working dry planographic printing plate is obtainable, (7) The occurrence of spoiling the image fidelity due to the nitrogen generated by exposure is remarkably prevented.

(8) Since the dyeing of the photosensitive layer is possible, the partially removal of the silicone rubber layer in the non-image area as well as the image area is easily detectable leading to the remarkable improvement in examination of the resultant printing plates, (9) Since the non-image area is coloured brown by the treatment with base, it is easy to discriminate between the image area and the non-image area in the operation of developing and on the resultant printing plates, and

(10) Since the non-image area of the printing plate has lost its photosensitivity there is no need to be careful in handling the printing plate even under bright light and there is no need to conduct necessarily an additional operation of desensitization.

The present invention will be further explained in and by, but in no way limited, the following examples.

EXAMPLE 1

An aluminum plate of 0.24 mm in thickness (manufactured by Sumitomo Light Metal Industries) was coated with phenolformaldehyde resol resin (Sumilite Resin ® PC-1, product of Sumitomo Durez Co. Ltd.) in thickness of $2\mu$ followed by curing at 190° C. for 3 min to form a base substrate. Onto the base substrate the following photosensitive composition was coated followed by heating at 120° C. for 2 min to obtain a photosensitive layer of 2µ in thickness.

The photosensitive composition contains;

| | |
|---|---|
| (a) Partially esterified phenol-formaldehyde novolak resin with naphthoquinone-1,2-diazide-5-sulfonic acid (Degree of esterification: 47% determined from IR spectrum) | 100 parts by weight |
| (b) 4,4'-Diphenylmethane diisocyanate | 30 parts by weight |
| (c) Dibutyltin dilaurate | 0.2 parts by weight |
| (d) Dioxane | 740 parts by weight |

Thereafter, the following silicone rubber composition was further coated by means of a whirler and then hardened by heating at 120° C. for 2 min in a humid atmosphere at the dew point of 30° C., thereby producing an image-forming laminated plate provided with a silicone rubber layer of 2µ in thickness on the photosensitive layer.

The silicone rubber composition contains;

| | |
|---|---|
| (a) Polydimethylsiloxane (Molecular weight: about 25,000, hydroxyl-terminated) | 100 parts by weight |
| (b) Vinyl-tris(methylethylketoxime)silane | 8 parts by weight |
| (c) Dibutyltin diacetate | 0.2 parts by weight |
| (d) γ-Aminopropyltrimethoxysilane | 1 part by weight |
| (e) Isopar ® E (product of Exxon Corp., solvent of aliphatic hydrocarbon) | 1,800 parts by weight |

The thus produced image-forming laminated plate was exposed on the whole surface thereof with UV light radiated from a metal halide lamp (Idlefin ® 2000 manufactured by Iwasaki Electric Co.) for 6 sec. at a distance of 1 m. The intensity of the UV light was 11 mW/cm$^2$. It was confirmed from IR spectrum that 18 molar % of the quinonediazide structure in the photosensitive layer was photo-decomposed into the carboxylic acid structure by this whole surface exposure.

After the whole surface exposure, the image-forming laminated plate was further exposed imagewise through a negative transparency having dot image of 150 lines per inch which was closely adhered to the surface of the laminated plate by superimposing in vacuo, by means of the above-mentioned metal halide lamp for 60 sec. at a distance of 1 m.

Then, a non-woven fabric cotton pad ("SOF PAD" manufactured by Dynic Corp.) was immersed into a base-treatment solution (Isopar ® H/butylcarbitol/ethylcellosolve/ethanolamine=90/5/5/0.1 in weight ratio), and the image-forming laminated plate after the completion of the exposing operation was sufficiently wetted with the base-treatment solution by using the cotton pad. After one minute, the area subjected to only the whole surface exposure was colored brown. Removing the base-treatment solution remaining on the surface of the image-forming laminated plate by the rubber squeezer, a developer (Isopar ® H/butylcarbitol/ethylcarbitol=20/40/40 in weight ratio) was poured onto both the plate and a developing pad. By lightly rubbing the surface of the plate with the developing pad, the silicone rubber layer in the imagewise exposed areas was removed to lay bare the surface of the photosensitive layer thereunder. On the other hand the silicone rubber layer in the areas subjected to only the whole surface exposure was firmly adhered to the underlying photosensitive layer to remain stably, thereby exactly reproducing the image borne on the negative transparency.

The thus formed printing plate was attached to an offset printing press ("Komori Sprint 2 Color") and a printing was made with ink of "Aqualess ST Cyan" (product of Toyo Ink Mfg. Co.) without using dampening water to yield a printed matter having a very good image reproducing 5% to 95% of halftone dots of 150 lines per inch. Even after printing 50,000 copies, there was observed neither the toning by ink on non-image area nor the damage of the printing plate surface, and the printing plate was in a state capable of being subjected to further printing. No change in image reproducibility was observed throughout the printing period.

On the other hand, another image-forming laminated plate produced in the same manner as above was exposed on the whole surface thereof by the same metal halide lamp at the light intensity of 11 mW/cm$^2$ for 60 sec. at a distance of 1 m. From IR spectrum inspection, 95 molar % of the quinonediazide structure in the photosensitive layer was found to be photo-decomposed by the whole surface exposure to such extent. Subsequently, repeating the imagewise exposure, the treatment with base and the development in the same manner as above-mentioned, the silicone rubber layer was removed throughout the whole surface and the image could not be formed.

EXAMPLE 2

A developer containing the base (Isopar ® H/butylcarbitol/ethylcellosolve/monoethanolamine=90/5/5/0.2 in weight ratio) was poured onto an image-forming laminated plate produced and exposed by repeating EXAMPLE 1 and onto the developing pad. Uniformly wetting the surface of the laminated plate with the developing pad, the areas subjected to only the whole surface exposure was colored brown. Further rubbing lightly with the developing pad, only the silicone rubber layer in the imagewise exposed areas was removed to lay bare the surface of the photosensitive layer thereunder. On the other hand, in the areas subjected to only the whole surface exposure, the silicone rubber layer remained firmly.

A printing plate exactly reproducing the image borne on the negative transparency was obtained as in EXAMPLE 1.

EXAMPLE 3

EXAMPLE 1 was repeated except for effecting the whole surface exposure by the metal halide lamp after the imagewise exposure through the negative transparency.

A printing plate which has no difference from the printing plate of EXAMPLE 1 was formed.

EXAMPLE 4

An aluminum plate of 0.24 mm in thickness (manufactured by Sumitomo Light Metal Industries) was coated with phenolformaldehyde resol resin (Sumilite Resin ® PC-1, product of Sumitomo Durez Co., Ltd.) in thickness of 1.7µ followed by curing at 180° C. for 3 min to form a base substrate. Onto the base substrate the following photosensitive composition was coated by means of a whirler followed by heating at 120° C. for 2 min to obtain a photosensitive layer of 2.3µ in thickness.

The photosensitive composition contains:

| (a) | Partial ester of phenol-formaldehyde novolak resin (Sumilite Resin ® PR50235, product of Sumitomo Durez Co., Ltd.) with naphthoquinone-1,2-diazide-5-sulfonic acid, having degree of esterification of 48% | 100 parts by weight |
|---|---|---|
| (b) | 4,4'-Diphenylmethane diisocyanate | 30 parts by weight |
| (c) | Dibutyltin dilaurate | 0.2 parts by weight |
| (d) | Dioxane | 2,000 parts by weight |

Thereafter, the following silicone rubber composition was further coated by means of a Mayer bar coater and then hardened by heating at 120° C. for 4 min in a humid atmosphere at the dew point of 30° C., thereby producing an image-forming laminated plate provided with a silicone rubber layer of 2.3μ in thickness on the photosensitive layer.

The silicone rubber composition contains;

| (a) | Polydimethylsiloxane (Molecular weight: about 25,000, hydroxyl-terminated) | 100 parts by weight |
|---|---|---|
| (b) | Vinyl-tris(methylethylketoxime)silane | 8 parts by weight |
| (c) | Dibutyltin diacetate | 0.1 parts by weight |
| (d) | γ-Aminopropyltrimethoxysilane | 0.5 parts by weight |
| (e) | Isopar ® E (product of Exxon Corp.) | 440 parts by weight |

After a positive transparency having dot image of 150 lines per inch is closely adhered to the surface of the image-forming laminated plate thus produced in vacuo in a normal manner, the plate was exposed imagewise by means of the metal halide lamp employed in EXAMPLE 1 for 9 sec. with the light intensity of 11 mW/cm² at a distance of 1 m. The exposed plate was immersed into a developer containing a base H/propylene glycol monomethyl ether/ethylcellosolve/monoethanolamine=90/5/5/0 3 in weight ratio). Rubbing the surface of the plate lightly with the developing pad, the silicone rubber layer in the unexposed areas is removed to lay bare the surface of the photosensitive layer thereunder as image areas, while the silicone rubber layer in the exposed areas was still remained as non-image areas without dissolving into the developer, thereby forming a printing plate exactly reproducing the image borne on the original film.

The thus formed printing plate was attached to an offset printing press ("Komori Sprint 2 Color") and a printing was made with ink of "Aqualess ST Cyan" (product of Toyo Ink Mfg. Co.) without using dampening water to yield a printed matter having a very good image reproducing 5% to 95% of halftone dots of 150 lines per inch. Even after printing 10,000 copies there was observed neither the toning by ink on non-image areas nor the damage of the printing plate surface, and the printing plate was in a state capable of being subjected to further printing

EXAMPLE 5

The image-forming laminated plate of EXAPLE 4 was projectively exposed imagewise for 15 sec. with the light intensity of 3.6 mW/cm² through the positive film while enlarging the original image on the positive film five times by means of a projection type magnifier (manufactured by Dai Nippon Screen Co., Ltd.). After the exposure, developing as in EXAMPLE 4, a printing plate exactly reproducing the five times enlarged image of the positive film was obtained.

EXAMPLE 6

Direct printing-plate making was carried out on the image-forming laminated plate of EXAMPLE 4 by using an actinic light reflected from the positive film as follows.

The actinic light emitted by two metal halide lamps of 2 kW power (manufactured by Iwasaki Electric Co., Ltd.) was reflected from the positive film which was located at a distance of 20 cm from the lamps. The reflected light was focused through a process camera into the original image on the image-forming laminated plate. The exposing conditions was that the intensity of light on the plate was 1 mW/cm² and the shutter speed of the process camera was 36 sec.

After this exposure, developing as in EXAMPLE 4, a printing plate exactly reproducing the original image borne on the positive film was formed.

EXAMPLE 7

A chemical conversion coated aluminum plate (manufactured by Sumitomo Light Metal Industries) was coated by means of whirler with a dioxane solution containing 3% by weight of partial ester of phenol-formaldehyde novolak resin (Sumilite Resin ® PR50235, product of Sumitomo, Durez Co., Ltd.) with naphthoquinone-1,2-diazide-5-sulfonic acid, the partial ester having the degree of esterification of 44% determined by IR spectrum and ethanol-soluble component of 9.7% by weight. Drying at 60° C. for 3 min, a photosensitive layer of 1.2μ in thickness was formed on the aluminum plate.

An Isopar ® E solution containing 7% by weight of the following silicone rubber composition was added with γ-aminopropyltriethoxysilane ("A 1100", product of UCC) by the amount of 4% by weight of the silicone rubber composition, and stirred homogeneously. The resultant solution was coated on the photosensitive layer by the whirler and dried. Heating at 120° C. for 4 min in a humid atmosphere at a dew point of 25° C., a silicone rubber layer of 2.2μ in thickness was obtained.

The silicone rubber composition contains;

| (a) | Polydimethylsiloxane (Molecular weight: about 80,000 hydroxyl-terminated at each chain end) | 100 parts by weight |
|---|---|---|
| (b) | Ethyltriacetoxysilane | 5 parts by weight |
| (c) | Dibutyltin diacetate | 0.2 parts by weight |

The thus produced image-forming laminated plate was exposed on whole surface thereof by using the metal halide lamp at light intensity of 11 mW/cm² for 10 sec. at a distance of 1 m, thereby 25 molar % of the quinonediazide structure in the photosensitive layer was photo-decomposed into the carboxylic acid structure.

Then, the image-forming laminated plate was exposed imagewise through a negative film closely adhered thereto, which has dot image of 150 lines per inch, by means of the metal halide lamp for 60 sec. at a distance of 1 m. Thereafter, the surface of the exposed plate was wetted with a developer containing a base, which contains 8 parts by weight of ethanol, 2 parts by weight of Isopar ® E and 0.3 parts by weight of benzylamine. Rubbing lightly with the developing pad, both the silicone rubber layer and the photosensitive layer in the imagewise exposed areas were removed to lay bare the surface of the chemical conversion coated aluminum plate, while the silicone rubber layer and the photosensitive layer in the areas subjected to only the whole surface exposure were both firmly remained, thereby obtaining a printing plate exactly reproducing the original image borne on the negative film.

The thus formed printing plate was attached, as in EXAMPLE 1, to the offset printing press and a printing was made with the ink of "Aqualess ST Cyan" without using dampening water to yield 20,000 copies of printed matter having a very good image reproducing 5% to 95% of halftone dots of 150 lines/inch.

EXAMPLE 8

The image-forming laminated plate produced in EXAMPLE 7, which is not yet subjected to any exposure was exposed image-wise through a positive film closely adhered to the plate, which has dot image of 150 lines per inch, by using the metal halide lamp at light intensity of 11 mW/cm$^2$ for 10 sec. at a distance of 1 m. The exposed plate was immersed into a developer containing a base, the composition of which is Isopar ® E/ethanol/benzylamine=50/50/5 in weight ratio. Rubbing lightly with the developing pad, the silicone rubber layer in the unexposed areas is easily removed to lay bare the surface of the photosensitive layer thereunder as image areas, while the silicone rubber layer in the exposed areas was firmly remained as non-image areas.

The thus formed printing plate possessed an image which is exactly reproduced the original image borne on the positive film and created printed matters of high image reproducibility.

EXAMPLE 9

A chemical conversion coated aluminum plate of 0.3 mm in thickness (manufactured by Sumitomo Light Metal Industries) was coated with the following photosensitive composition by means of the whirler followed by heating at 120° C. for 2 min to provide a photosensitive layer of 2.6μ in thickness.

The photosensitive composition contains;

| | | |
|---|---|---|
| (a) | Partial ester of phenol-formaldehyde novolak resin (Sumilite Resin ® PR50235, product of Sumitomo Durez Co.) with naphthoquinone-1,2-diazide-5-sulfonic acid, having the degree of esterification of 44% | 100 parts by weight |
| (b) | 4,4'-Diphenylmethane diisocyanate | 20 parts by weight |
| (c) | Dibutyltin dilaurate | 0.2 parts by weight |
| (d) | Methylcellosolve acetate | 2,000 parts by weight |

A solution of 0.5% by weight of γ-aminopropyltriethoxysilane ("A 1100", product of UCC) in Isopar ® E (product of Exxon Corp.) was coated on the photosensitive layer by means of the whirler and dried at 110° C. for 30 sec.

Subsequently, the following silicone rubber composition was further coated and cured by heating at 120° C. for 2 min in a humid atmosphere at a dew point of 30° C. to form a silicone rubber layer of 2μ in thickness.

The silicone rubber composition contains;

| | | |
|---|---|---|
| (a) | Polydimethylsiloxane (Molecular weight: about 80,000, hydroxy-terminated at each chain end) | 100 parts by weight |
| (b) | Ethyltriacetoxysilane | 5 parts by weight |
| (c) | Dibutyltin diacetate | 0.2 parts by weight |
| (d) | Isopar ® E | 1,650 parts by weight |

The thus produced image-forming laminated plate was exposed on the whole surface thereof by using a super high-pressure mercury lamp ("Jet Light 3300" manufactured by Oak, Ltd., power of 2 kW) at the light intensity of 11 mW/cm$^2$ for 12 sec. at a distance of 1 m. By this whole surface exposure, 38 molar % of the quinonediazide structure in the photosensitive layer was confirmed to be photo-decomposed by IR spectrum inspection.

The image-forming laminated plate produced such a specified amount of the carboxylic acid structure was further exposed imagewise through the negative film closely adhered to the plate surface, which has dot image of 150 lines per inch by means of the same mercury lamp for 60 sec. at a distance of 1 m.

Thereafter, the developing pad was soaked with a developer containing a base Isopar ® H/propylene glycol monomethyl ether/ethylcellosolve/monoethanolamine=80/10/10/1 in weight ratio). By lightly and uniformly wetting the surface of the exposed plate with the soaked developing pad the areas subjected to only the whole surface exposure was colored brown. Rubbing with the soaked developing pad, the silicone rubber layer in the areas subjected to the imagewise exposure was completely removed to lay bare the surface of the photosensitive layer thereunder as image areas, while the silicone rubber layer in the areas subjected to only the whole surface exposure was still remained firmly as non-image areas. A printing plate having an ability to exactly reproduce the original image borne on the negative film was obtained and 25,000 copies of printed matter with favorable results were obtained by subjecting the printing plate to planographic printing without dampening water.

EXAMPLE 10

The image-forming laminated plate produced in the same manner as in EXAMPLE 9 was exposed imagewise through the positive film closely adhered to the plate surface, which has dot image of 150 lines per inch, by the metal halide lamp manufactured by Iwasaki Electric Co. (Idlefin 2000) at the light intensity of 11 mW/cm$^2$ for 15 sec. at a distance of 1 m.

Then, the developing pad was soaked with a developer containing a base Isopar ® H/propylene glycol monomethyl ether/ethylcellosolve/monoethanolamine=90/5/5/0.2 in weight ratio). By uniformly wetting the plate surface with the soaked developing pad, the exposed area was colored brown. Subsequently, rubbing with the developing pad, the silicone rubber layer in the unexposed areas was removed to lay bare the surface of the photosensitive layer thereunder, and on the other hand the silicone rubber layer in the exposed areas was firmly remained on the photosensitive layer thereunder, thereby exactly reproducing the original image borne on the positive film.

EXAMPLE 11

An aluminum plate of 0.24 mm in thickness manufactured by Sumitomo Light Metal Industries was coated with phenolformaldehyde resol resin (Sumilite Resin ® PC-1, product of Sumitomo Durez Co., Ltd.) in thickness of 2μ followed by curing at 200° C. for 3 min to form a base substrate. Onto the base substrate, coated was a dioxane solution containing 7% by weight of partial ester of phenol-formaldehyde novolak resin (Sumilite Resin® PR50235, product of Sumitomo Durez Co., Ltd.) with naphthoquinone-1,2-diazide-5-sulfonic acid, the partial ester having the degree of esterification of 44% determined by IR spectrum inspection and ethanol-soluble component of 9.7% by weight. After drying at 60° C. for 3 min, a photosensitive layer of 2.7μ in thickness was obtained. Thereafter, a solution of 0 5% by weight of γ-aminopropyltrimethoxysilane ("A 0800" manufacture by Chisso Corp.) in Isopar® E (product of Exxon Corp.) was coated on the photosensitive layer by means of the whirler and dried at 120° C. for 30 sec.

Furthermore, a solution of 7% by weight of the following silicone rubber composition in Isopar® E was coated thereon by means of the whirler and cured by heating at 120° C. for 4 min in a humid atmosphere of dew point of 30° C. The thus obtained silicone rubber layer has a thickness of 2.2μ.

The silicone rubber composition contains;

| | |
|---|---|
| (a) Polydimethylsiloxane (Molecular weight: about 80,000, hydroxyl-terminated) | 100 parts by weight |
| (b) Vinyl-tris(ethylmethylketoxime)silane | 6 parts by weight |
| (c) Dibutyltin diacetate | 0.2 parts by weight |

The image-forming laminated plate produced in the above-mentioned manner was exposed on the whole surface thereof by using a chemical lamp ("Master Printer A3" manufactured by Toko, Inc.) at the light intensity of 2.5 mW/cm² for 10 sec. at a distance of 5 cm. According to the predetermined calibration curve indicating the relation of the photo-decomposition rate and the exposure, the amount of the exposing light in the above whole surface exposure was found to be corresponding to the photo-decomposition of 15 molar % of the quinonediazide structure in the photosensitive layer.

The image-forming laminated plate in which such a specified amount of the quinonediazide structure was converted to the carboxylic acid structure was exposed imagewise through the closely adhered negative film having dot image of 150 lines per inch by means of the super high-pressure mercury lamp ("Jet Light" manufactured by Oak, Ltd., power of 2 kW) for 70 sec. at a distance of 1 m.

The image-forming laminated plate after the completion of the exposing operation was wetted on the surface thereof by the developing pad soaked with a developer containing a base Isopar® E/ethanol/water/2-amino-2-methyl-1,3-propanediol=65/3/0.5 in weight ratio). The color of the areas subjected to only the whole surface exposure was changed into brown. Further rubbing with the same soaked developing pad, both the silicone rubber layer and the photosensitive layer in the image-wise exposed areas were completely removed in a short time to lay bare the surface of the base substrate, while the silicone rubber layer and the photosensitive layer in the areas subjected to only the whole surface exposure were both firmly remained. The thus obtained printing plate had an ability to exactly reproduce the original image borne on the negative film.

EXAMPLE 12

Onto a composite base substrate provided with a chloroprene-rubber layer having rubber hardness of 60 (Shore hardness A) and thickness of 0.3 mm on an aluminum plate of 0.3 mm in thickness, coated was a dioxane solution containing 10% by weight of partial ester of phenol-formaldehyde novolak resin (Sumilite Resin® PR50235 manufactured by Sumitomo Durez Co., Ltd.) with naphthoquinone-1,2-diazide-5-sulfonic acid, having the degree of esterification of 44%. After drying while blowing a hot air stream of 60° C., a photosensitive layer of 3μ in thickness was obtained. Onto the photosensitive layer thus formed, a solution of 10% by weight of the following silicone rubber composition in n-hexane was coated and cured by heating in a hot and humid air stream of 120° C. and dew point of 30° C. for 4 min to form the silicone rubber layer of 2.5μ in thickness.

The silicone rubber composition contains;

| | |
|---|---|
| (a) Polydimethylsiloxane (Molecular weight: 30,000, hydroxyl-terminated) | 100 parts by weight |
| (b) Methyltriacetoxysilane | 6 parts by weight |
| (c) Dibutyltin diacetate | 0.2 parts by weight |
| (d) γ-aminopropyltrimethoxysilane | 0.5 parts by weight |
| (e) Dibutoxy-bis(ethylacetoacetato) titanium | 3 parts by weight |

The image-forming laminated plate produced in this manner was exposed imagewise through the negative film closely adhered to the plate surface by using the super high-pressure mercury lamp for 60 sec. at a distance of 1 m.

Thereafter, the image-forming laminated plate subjected to such exposure was wetted with a developer containing a base (ethanol/Isopar® E/water/monoethanolamine=65/35/3/0.2 in weight ratio). By rubbing lightly with the developing pad, the imagewise exposed areas were removed without difficult to lay bare the surface of the chloroprene-rubber layer of the base substrate, while the unexposed area retained the uppermost silicone rubber layer firmly, thereby obtaining a printing plate exactly reproducing the original image borne on the negative film.

EXAMPLE 13

Onto a composite base substrate provided with a nitrile-rubber layer having rubber hardness of 70 (Shore hardness A) and thickness of 0.25 mm on a polyester film of 0.2 mm in thickness ("Lumirror" manufactured by Toray Industries, Inc.), a dioxane solution containing 7% by weight of partial ester of phenol-formaldehyde novolak resin (Sumilite Resin® PR50235 manufactured by Sumitomo Durez Co., Ltd.) with naphthoquinone-1,2-diazide-5-sulfonic acid, the partial ester having the degree of esterification of 44% determined by IR spectrum and ethanol-soluble component of 9.7% by weight, was coated by means of the whirler and dried at 60° C. for 3 min to form a photosensitive layer of 2.7μ in thickness. Onto the thus obtained photosensitive layer, a solution of 0.5% by weight of γ-aminopropyltrimethoxysilane ("A 0800" manufactured by Chisso Corp.) in Isopar® E (manufactured by Exxon Corp.) was coated by means of the whirler and dried at 120° C. for 30 sec. Further, a solution of 7% by weight of the following silicone rubber composition in Isopar® E was coated thereon by the whirler and cured by heating at 120° C. for 4 min under the dew point of 30° C. to form a silicone rubber layer of 2.2μ in thickness.

The silicone rubber composition contains;

| | | |
|---|---|---|
| (a) | Polydimethylsiloxane (Molecular weight: about 80,000, hydroxyl-terminated) | 100 parts by weight |
| (b) | Ethyltriacetoxysilane | 5 parts by weight |
| (c) | Dibutyltin diacetate | 0.2 parts by weight |

The thus formed image-forming laminated plate was exposed on the whole surface thereof by means of the metal halide lamp ("Idlefin 2000" manufactured by Iwasaki Electric Co.) at the light intensity of 11 mW/cm² for 9 sec. at a distance of 1 m. Subsequently, the plate was further exposed imagewise through the negative film having dot image of 100 lines per inch by means of the same metal halide lamp for 90 sec. at a distance of 1 m.

The plate after the whole surface exposure and the imagewise exposure was subjected to the developing operation as in EXAMPLE 12 to form a printing plate bearing a sharp image, boundaries of which were precisely defined.

EXAMPLE 14

A composite base substrate of an aluminum plate of 0.3 mm in thickness and a chloroprene-rubber layer having rubber hardness of 60 (Shore hardness A) and thickness of 0.3 mm was coated with the following photosensitive composition and dried at 120° C. for 2 min to obtain a photosensitive layer.

The photosensitive composition contains;

| | | |
|---|---|---|
| (a) | Partial ester of phenol-formaldehyde novolak resin with naphthoquinone-1,2-diazide-5-sulfonic acid (Degree of esterification: 47% determined by IR spectrum) | 100 parts by weight |
| (b) | Poly(phenylenemethylene)polyisocyanate ("MR 200" manufactured by Nippon Polyurethane Co., Ltd.) | 30 parts by weight |
| (c) | Dibutyltin dilaurate | 0.2 parts by weight |
| (d) | Dioxane | 740 parts by weight |

After that, the following silicone rubber composition was further coated thereon by the whirler and cured at 120° C. for 2 min under the dew point of 30° C. to form a silicone rubber layer, thereby producing an image-forming laminated plate.

The silicone rubber composition contains;

| | | |
|---|---|---|
| (a) | Polydimethylsiloxane (Molecular weight: about 25,000, hydroxyl-terminated) | 100 parts by weight |
| (b) | Vinyl-tris(methylethylketoxime)silane | 8 parts by weight |
| (c) | Dibutyltin diacetate | 0.2 parts by weight |
| (d) | γ-[N—aminoethylaminopropyl]trimethoxysilane | 1 part by weight |
| (e) | Isopar ® E | 1,800 parts by weight |

The image-forming laminated plate was exposed on the whole surface thereof by means of the metal halide lamp at the light intensity of 11 mW/cm² for 13 sec. at a distance of 1 m. Successively, the plate was exposed imagewise through the closely adhered negative film having dot image of 100 lines per inch by the same metal halide lamp for 75 sec. at a distance of 1 m in the conventional manner.

The thus treated plate was uniformly wetted by the non-woven fabric cotton pad soaked with a base-treatment solution Isopar ® H/butylcarbitol/ethylcellosolve/monoethanolamine=90/5/5/0.1 in weight ratio). After about one minute, the area subjected to only the whole surface exposure was colored dark brown. Then, after removing the excess base-treatment solution remained on the plate surface, the plate surface was rubbed with the developing pad sufficiently soaked with a developer Isopar ® H/butylcarbitol/ethylcarbitol=20/40/40 in weight ratio). As a result, the silicone rubber layer in the imagewise exposed areas was eliminated to lay bare the surface of the photosensitive layer. On the other hand, the silicone rubber layer in the areas subjected to only the whole surface exposure was not eliminated but firmly adhered to the photosensitive layer thereunder.

In the printing plate thus formed, the bared surface of the photosensitive layer became the ink-receptive areas or image areas, while the surface of the still remained silicone rubber layer became the ink-repellent areas or non-image areas. The printing plate had an image fairly coincident with the original image borne on the negative film.

EXAMPLE 15

EXAMPLE 1 was repeated provided that the whole surface exposure was effected after the formation of the photosensitive layer and before the coating of the silicone rubber layer.

After carrying out the imagewise exposure, the treatment with base and the development as in EXAMPLE 1, no difference was found between the resultant printing plates of both examples.

EXAMPLE 16

The image-forming laminated plate produced in EXAMPLE 1 was further laminated with a polypropylene protective layer of 8μ in thickness by means of a laminator for the purposes of the protection of the plate surface and the improvement in the adhesion in vacuo to the original film to be overlaid thereon.

The whole surface exposure and then the imagewise exposure or vice versa were carried out as in EXAMPLE 1, and subsequently after eliminating the protective layer, the treatment with base and the development were carried out in the same manner as in EXAMPLE 1 or 2. At printing plate having a satisfactory image without spoiling the image fidelity was also formed in this case.

EXAMPLE 17

A photosensitive layer of 2.8μ in thickness was formed on a base substrate of chemical conversion coated aluminum plate (manufactured by Sumitomo Light Metal Industries) by coating the substrate with a photosensitive composition containing 7 parts by weight of partial ester of phenol-formaldehyde novolak resin (Sumilite Resin ® PR50235 manufactured by Sumitomo Durez Co.) with naphthoquinone-1,2-diazide-5-sulfonic acid (degree of esterification: 44%), 3 parts by weight of chlorinated polypropylene (Superchlone ® 306, manufactured by Sanyo Kokusaku Pulp Co., Ltd.) and 133 parts by weight of dioxane by means of a bar coater, and then by drying at 60° C. Onto the surface of the photosensitive layer, a solution of 0.2% by weight of γ-aminopropyltriethoxysilane ("A 1100" manufactured by UCC) in Isopar ® E (product of Exxon Corp.) was coated by means of the whirler and dried at 110° C. for one min. Successively, a solution of 7% by weight of the following silicone rubber composition in Isopar ® E was further coated thereon by the whirler and cured at 100° C. for 2 min to obtain a silicone rubber layer of 2.2μ in thickness.

The silicone rubber composition contains;

| (a) | Polydimethylsiloxane (Molecular weight: about 80,000, hydroxyl-terminated) | 100 parts by weight |
| (b) | Ethyltriacetoxysilane | 5 parts by weight |
| (c) | Dibutyltin diacetate | 0.2 parts by weight |

The thus produced image-forming laminated plate was exposed on the whole surface thereof by means of the metal halide lamp at the light intensity of 11 mW/cm² for 5 sec. at a distance of 1 m. Subsequently, the plate was exposed imagewise through the closely adhered negative film having dot image of 100 lines per inch by means of the metal halide lamp for 60 sec. at a distance of 1 m.

After the exposing operation, the plate was immersed into the mixed solution (ethanol/Isopar ® E/benzylamine=5/5/0.5 in weight ratio). After the areas subjected to only the whole surface exposure was colored brown, the plate surface was lightly rubbed with the developing pad. The silicone rubber layer in the imagewise exposed areas was removed to lay bare the surface of the photosensitive layer. On the other hand, the silicone rubber layer in the areas subjected to only the whole surface exposure was still remained firmly. The printing plate obtained in this manner had an image exactly reproducing the original image borne on the negative film.

EXAMPLE 18

An aluminum plate of 0.24 mm in thickness (manufactured by Sumitomo Light Metal Industries) was coated with phenolformaldehyde resol resin (Sumilite Resin ® PC-1 manufactured by Sumitomo Durez Co.) in thickness of 2μ followed by curing at 190° C. for 3 min to form a base substrate. The following photo-sensitive composition was coated on the substrate and heated at 120° C. for 2 min to obtain a photosensitive layer of 2μ in thickness.

The photosensitive composition contains;

| (a) | Partial ester of phenol-formaldehyde novolak resin with naphthoquinone-1,2-diazide-5-sulfonic acid (Degree of esterification: 47% determined by IR spectrum) | 100 parts by weight |
| (b) | 4,4'-Diphenylmethane diisocyanate | 30 parts by weight |
| (c) | Dibutyltin dilaurate | 0.2 parts by weight |
| (d) | p-Toluenesulfonic acid | 0.8 parts by weight |
| (e) | Dioxane | 740 parts by weight |

Then, the following ailicone rubber composition was coated on the photosensitive layer by means of the whirler and cured by heating at 120° C. for 3 min under the dew point of 30° C. to obtain a silicone rubber layer of 2μ in thickness, thereby producing an image-forming laminated plate.

The silicone rubber composition contains;

| (a) | Polydimethylsiloxane (Molecular weight; about 25,000, hydroxyl-terminated) | 100 parts by weight |
| (b) | Vinyl-tris(methylethylketoxime)silane | 8 parts by weight |
| (c) | Dibutyltin diacetate | 0.1 parts by weight |
| (d) | γ-Aminopropyltrimethoxy silane | 0.5 parts by weight |
| (e) | Isopar ® E (product of Exxon Corp.) | 1800 parts by weight |

The image-forming laminated plate was exposed on the whole surface thereof by means of the metal halide lamp (Idelfin ® 2000 manufactured by Iwasaki Electric Co.) at the light intensity of 11 mW/cm² for 10 sec. at a distance of 1 m. Thereafter, the plate surface was laminated with a polypropylene film of 13μ in thickness (manufactured by Toray Industries, Inc.) as a cover film by a laminator. Successively, the plate provided with the cover film was exposed imagewise through the closely adhered negative film having dot image of 150 lines per inch by means of the metal halide lamp for 60 sec. at a distance of 1 m in a conventional manner.

After eliminating the cover film, the surface of the exposed plate was completely wetted with the base-treatment solution of EXAMPLE 1 by the non-woven fabric cotton pad. When the plate surface was colored brown imagewise, the excess amount of the base-treatment solution remained on the surface was squeezed off. Rubbing the plate surface lightly by the developing pad soaked with a developer (Isopar ® H/butylcarbitol/ethylcarbitol/2-ethylhexanoic acid/crystal violet=20/40/40/2/0.2 in weight ratio), the silicone rubber layer in the imagewise exposed areas was removed to lay bare the purple-dyed surface of the photosensitive layer thereunder, while the silicone rubber layer in the areas subjected to only the whole surface exposure was still remained firmly without dyed purple. After washing and drying the plate surface, the thus produced printing plate exactly reproduced the original image borne on the negative film and explicitly discriminated the non-image areas (undyed) from the image areas (dyed), which meant the printing plate had a fairly high image reproducibility.

Incidentally, the dyeing of the image areas may be carried out not simultaneously with the development but after the development. For instance, in the foregoing dying of the image areas, the dyeing was carried out with a dyeing solution (carbitol acetate/ethylene glycol/crystal violet=30/70/3 in weight ratio) after developing with the developer of EXAMPLE 1 instead of at the same time of the development, but no difference was found therebetween.

EXAMPLE 19

The image-forming laminated plate of EXAMPLE 1 was subjected to the whole surface exposure and the imagewise exposure in the same manner as in EXAMPLE 1 and subsequently developed with a developer containing a base listed in the following Table 1. Each developer containing the base produced a printing plate having a favorable or acceptable image.

TABLE 1

| Base | Composition of developer containing base (weight ratio) |
|---|---|
| Propylamine | Isopar ® H/ethanol/Base = 50/50/1 |
| 2-Amino-2-methyl-1,3-propanediol | Isopar ® H/butylcarbitol/ethylcarbitol/Base = 20/40/40/0.5 |
| 2-(2-Aminoethyl-amino)ethanol | Isopar ® H/butylcarbitol/ethylcarbitol/Base = 20/40/40/0.5 |
| 2-(2-Aminoethyl-amino)ethanol | Isopar ® H/propylene glycol monomethyl ether/water/Base = 20/80/3/0.5 |
| Sodium ethylate | ethanol/Base = 100/0.1 |

TABLE 1-continued

| Base | Composition of developer containing base (weight ratio) |
|---|---|
| Lithium hydroxide | ethanol/water/Base = 100/3/0.05 |

EXAMPLE 20

A composite base substrate provided with an NBR layer having rubber hardness of 70 and thickness of 300μ on a "Lumirror" layer of 200μ in thickness (polyester film manufactured by Toray Industries, Inc.) was coated with a solution of 4% by weight of partial ester of phenol-formaldehyde novolak resin (Sumilite® PR50235 manufactured by Sumitomo Durez Co.) with naphtoquinone-1,2-diazide-5-sulfonic acid (degree of esterification: 50%) in dioxane by means of the whirler, and then dried at 100° C. for 2 min to obtain a photosensitive layer of 2 g/m² in thickness.

Onto the photosensitive layer, a solution of 2.8% by weight of di-n-butoxy-bis(acetylacetonato)titanium in Isopar® E (product of Exxon Corp.) was coated by the bar coater and dried at 120° C. for 1 min to obtain an adhesive layer of 0.1 g/m² in thickness.

Further, the following silicone rubber composition was coated on the adhesive layer by means of the whirler and dried at 120° C. for 4 min under the dew point of 30° C. to obtain a silicone rubber layer of 2.5 g/m² in thickness.

The silicone rubber composition contains;

| | | |
|---|---|---|
| (a) | Polydimethylsiloxane (Molecular weight: about 22,000, hydroxyl-terminated in each chain end) | 100 parts by weight |
| (b) | Ethyltriacetoxysilane/methyltriacetoxysilane (1/1 mixture) | 6 parts by weight |
| (c) | Dibutyltin diacetate | 0.12 parts by weight |
| (d) | Isopar® E | 1370 parts by weight |

The thus formed image-forming laminated plate was exposed imagewise through the closely adhered negative film having dot image of 100 lines per inch by means of the super high-pressure mercury lamp at the light intensity of 11 mW/cm² for 90 sec. at a distance of 1 m.

Then, the exposed plate was immersed into a developer containing a base (ethanol/Isopar® E/monoethanolamine=65/35/0.5) and the plate was colored dark brown imagewise. Rubbing with the developing pad lightly, the silicone rubber layer in the imagewise exposed areas was removed together with the photosensitive layer in the same areas, thereby obtaining a printing plate having a image completely coincide with the original image borne on the negative film.

The printing plate was subjected to the direct printing, thereby obtaining 20,000 copies of printed matters having fairly good results.

EXAMPLE 21

An aluminum plate of 0.24 mm in thickness (manufactured by Sumitomo Light Metal Industries) was coated with resol resin (Sumilite Resin® PC-1, product of Sumitomo Durez Co.) in thickness of 1 g/m² followed by curing at 190° C. for one and half minutes to form a base substrate.

A dioxane solution containing 1.4% by weight of ester of phenol-formaldehyde novolak resin with naphthoquinone-1,2-diazide-5-sulfonic acid was coated on the surface of the base substrate by means of the whirler and dried at 100° C. for 2 min to form a photosensitive layer of 0.5 g/m² in thickness.

Successively, the following silicone rubber composition was coated on the photosensitive layer by means of the bar coater and cured at 120° C. for 4 min under the dew point of 30° C. to form a silicone rubber layer of 2.3 g/m² in thickness.

The silicone rubber composition contains;

| | | |
|---|---|---|
| (a) | Polydimethylsiloxane (Molecular weight: about 22,000, hydroxyl-terminated in each chain end) | 100 parts by weight |
| (b) | Vinyl-tris(methylethylketoxime)silane | 8 parts by weight |
| (c) | Dibutyltin diacetate | 0.1 parts by weight |
| (d) | Di-iso-propyloxy-bis(acetylacetonato) titanium | 4.9 parts by weight |
| (e) | Isopar® E | 360 parts by weight |

The thus obtained image-forming laminated plate was closely adhered to a negative film having dot image of 100 lines/inch in vacuo. Then, the laminated plate was exposed imagewise through the negative film by means of the metal halide lamp for 60 sec. at a distance of 1 m. After eliminating the negative film from the plate, the plate was further exposed on the whole surface thereof by means of the same lamp at the light strength of 11 mW/cm² for 10 sec.

The plate exposed two times in the above-mentioned manner was immersed into a developer containing a base Isopar® E/butylcarbitol/monoethanolamine=40/60/1 in weight ratio) and rubbed with the developing pad lightly. Both the silicone rubber layer and the photosensitive layer in the imagewise exposed areas were removed by the rubbing to lay bare the surface of the base substrate thereunder, thereby obtaining a printing plate exactly reproducing the original image borne on the negative film.

EXAMPLE 22

EXAMPLE 1 was repeated except for employing another photosensitive composition.

The photosensitive composition employed in this example was listed in the following Table 2.

In this example, there was also obtained a printing plate having the extremely high image reproducibility and durability in the printing operation as in EXAMPLE 1 while employing any photosensitive composition shown in Table 2.

TABLE 2

| | Photosensitive Composition | | | |
|---|---|---|---|---|
| Photosensitive Composition | Photosensitive Product (parts by weight) | Isocyanate (parts by weight) | Organotin Compound (parts by weight) | Solvent (parts by weight) |
| 1 | partial ester of polyhydroxybenzene with naphthoquinone-1,2-diazide-5-sulfonic acid | 4,4'-diphenylmethane diisocyanate (20) | dibutyltin dilaurate (0.2) | dioxane (740) |

TABLE 2-continued

| Photosensitive Composition | Photosensitive Composition | | | |
|---|---|---|---|---|
| | Photosensitive Product (parts by weight) | Isocyanate (parts by weight) | Organotin Compound (parts by weight) | Solvent (parts by weight) |
| 2 | (100) ester of pyrogallol-acetone resin with naphthoquinone-1,2-diazide-5-sulfonic acid (100) | none | none | dioxane (740) |
| 3 | amide of poly(p-aminostyrene) with naphthoquinone-1,2-diazide-5-sulfonic acid (100) | none | none | dioxane (740) |
| 4 | ester of poly(p-hydroxystyrene) with naphthoquinone-1,2-diazide-5-sulfonic acid (100) | none | none | dioxane (740) |
| 5 | ester of cresol-formaldehyde novolak resin with naphtho-quinone-1,2-diazide-5-sulfonic acid (100) | addition product of 2,4-diisocya-nate toluene with trimethylol-propane* (40) | dibutyltin dilau-rate (0.2) | dioxane (740) |

*Colonate-L ® manufactured by Nippon Polyurethane Co., Ltd.

EXAMPLE 23

The image-forming laminated plate produced in EXAMPLE 1 was closely adhered in vacuo to the negative film having dot image of 150 lines per inch in a normal manner, and then exposed imagewise through the negative film by means of the metal halide lamp employed in EXAMPLE 1 at the light intensity of 11 mW/cm² for 60 sec at a distance of 1 m. By this imagewise exposure, 95 molar % of the quinonediazide structure in the photosensitive layer was photo-decomposed in the imagewise exposed areas.

Subsequently, the exposed plate was immersed into a developer containing a base (Isopar ® H/butylcarbitol/monoethanolamine=40/60/1 in weight ratio) and rubbed with the developing pad lightly. By the rubbing, the silicone rubber layer in the imagewise exposed areas was removed to lay bare the surface of the underlying photosensitive layer.

The thus formed printing plate had exactly reproduced the original image borne on the negative film.

EXAMPLE 24

The image-forming laminated plate of EXAMPLE 7 was closely adhered in vacuo to the nagative film having dot image of 150 lines per inch in a normal manner, and then exposed imagewise through the negative film by means of the metal halide lamp employed in EXAMPLE 1 at the light intensity of 11 mW/cm² for 60 sec at a distance of 1 m. By this exposure, almost all quinonediazide structure in the photosensitive layer was photo-decomposed in the imagewise exposed areas.

Subsequently, the exposed plate was immersed into a developer containing a base (ethanol/monoethanolamine=90/10 in weight ratio) and rubbed with the developing pad lightly. By the rubbing, both the silicone rubber layer and the photosensitive layer in the imagewise exposed areas were removed to lay bare the surface of the underlying aluminum substrate.

The thus formed printing plate had exactly reproduced the original image borne on the negative film and offered printing matters with favorable results by subjecting to the planographic printing without dampening water.

What is claimed is:

1. A process for treating a dry planographic printing unprocessed plate comprising a base substrate, a photosensitive layer containing a quinonediazide and a silicone rubber layer in laminating order, characterized in that the dry planographic printing unprocessed plate is subjected to a treatment with a base after imagewise exposure but before or at the same time of development said base being present in an amount sufficient to enhance both the adhesion of the photosensitive layer to the silicone rubber layer and the solvent resistance of the photosensitive layer in non-image areas.

2. The process of claim 1 wherein the base is an organic base.

3. The process of claim 2 wherein the organic base is an amine compound.

4. The process of claim 1 wherein a whole surface slight exposure of the plate is effected before the imagewise exposure.

5. The process of claim 1 wherein a whole surface slight exposure of the plate is effected after the imagewise exposure and before the treatment with base.

6. The process of claim 4 or 5 wherein the whole surface slight exposure is effected to the extent that 5 to 60 molar % of the quinonediazide in the photosensitive layer is photo-decomposed.

7. The process of claim 4 or 5 wherein the imagewise exposure is effected through a negative original to the extent that at least 70 molar % of the quinonediazide in the photosensitive layer is photo-decomposed.

8. The process of claim 1 wherein an imagewise slight exposure is effected through a positive original to the extent that 5 to 60 molar % of the quinonediazide in the photosensitive layer is photo-decomposed.

9. The process of claim 1 wherein an imagewise exposure is effected through a negative original to the extent that at least 70 molar % of the quinonediazide in the photosensitive layer is photo-decomposed.

10. The process of claim 1 wherein the imagewise exposure is effected through a negative original to the extent that at least 70 molar % of the quinonediazide in the photosensitive layer of imagewise exposed area is photo-decomposed to form a latent image, after eliminating the negative original a whole surface slightexposure is effected to the extent that 5 to 60 molar % of the quinonediazide in the photosensitive layer of imagewise unexposed areas is photo-decomposed, and subsequently the treatment with base is effected before or at the same time of development with at least the silicone rubber layer in image areas is removed by the development, thereby producing a negative working dry planographic printing plate.

11. The process of claim 1 wherein before the imagewise exposure a whole surface slight exposure is effected to the extent that 5 to 60 molar % of the quinonediazide in the photosensitive layer is photo-decomposed, and then the imagewise exposure is effected through a negative original to the extent that at least 70 molar % of the quinonediazide in the photosensitive layer of imagewise exposed areas is photo-decomposed to form a latent image, subsequently the treatment with base is effected before or at the same time of development and at least the silicone rubber layer in image areas is removed by the development, thereby producing a negative working dry planographic printing plate.

12. The process of claim 1 wherein the imagewise slight exposure is effected through a positive original to the extent that 5 to 60 molar % of the quinonediazide in the photosensitive layer of imagewise exposed areas is photo-decomposed to form a latent image, and subsequently the treatment with base is effected before or at the same time of development and at least silicone rubber layer in image areas is removed by the development, thereby producing a positive working dry planographic printing plate.

13. The process of claim 1 wherein the imagewise exposure is effected through a negative original to the extent that at least 70 molar % of the quinonediazide in the photosensitive layer of imagewise exposed areas is photo-decomposed to form a latent image, and subsequently the treatment with base is effected before or at the same time of development and at least the silicone rubber layer in the image areas is removed by the development, thereby producing a negative working dry planographic printing plate.

14. The process of claim 1 wherein an adhesive layer of aminosilane and/or organotitanate is interposed between the photosensitive layer and the silicone rubber layer, or the aminosilane and/or organotitanate is contained in the silicone rubber layer.

* * * * *